(12) United States Patent
Nam

(10) Patent No.: US 6,248,640 B1
(45) Date of Patent: Jun. 19, 2001

(54) METHOD FOR FORMING CAPACITOR OF SEMICONDUCTOR DEVICE USING HIGH TEMPERATURE OXIDATION

(75) Inventor: Sang-don Nam, Yongin (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 09/344,585

(22) Filed: Jun. 25, 1999

(30) Foreign Application Priority Data

Jun. 25, 1998 (KR) .................................................. 98-24161

(51) Int. Cl.[7] .................................................. H01L 21/20
(52) U.S. Cl. .......................... 438/396; 438/399; 438/253; 438/682
(58) Field of Search .................................... 438/396, 399, 438/253, 256, 649, 682

(56) References Cited

U.S. PATENT DOCUMENTS 5,316,982 * 5/1994 Taniguchi .............................. 438/396
5,985,731 * 11/1999 Weng et al. .......................... 438/396

\* cited by examiner

*Primary Examiner*—Chandra Chaudhari
*Assistant Examiner*—Yennhu B. Huynh
(74) *Attorney, Agent, or Firm*—Marger Johnson & McCollom, P.C.

(57) ABSTRACT

A method of forming a capacitor of a semiconductor device which can prevent disconnection between lower electrodes by blanket-depositing a second conductive film for silicidation on a semiconductor substrate and forming an oxide of the second conductive film such as titanium dioxide ($TiO_2$) on an interlayer dielectric using high temperature oxidation, before depositing a dielectric film, and which can obtain a high capacitance by forming both a silicide layer including the second conductive film, and the oxide of the second conductive film such as titanium dioxide ($TiO_2$) having a high dielectric constant, on a lower electrode, and using the silicide layer and oxide as the dielectric film.

10 Claims, 3 Drawing Sheets

METHOD FOR FORMING CAPACITOR OF SEMICONDUCTOR DEVICE USING HIGH TEMPERATURE OXIDATION

BACKGROUND OF THE INVENTION

1. Field of the Invention

The present invention relates to a method for fabricating a semiconductor device, and more particularly, to a method for forming a capacitor of a semiconductor device.

2. Description of the Related Art

With the development of technology for manufacturing semiconductor integrated circuits (IC) and extension of their application fields, development of large capacity memory devices is in progress. Large capacity memory devices are highly integrated, thus reducing the area of a memory cell unit and cell capacitance.

Particularly, in a dynamic random access memory (DRAM) device comprised of a capacitor for use as an information storage unit and a switching transistor connected to the capacitor, a reduction in cell capacitance due to a decrease in the area of the memory cell unit lowers the read-out capability of the memory cell and increases soft error. Therefore, the reduction in cell capacitance must be prevented, to achieve high integration of the memory devices.

A capacitor for a semiconductor memory device is comprised of a storage node being a lower electrode, a dielectric film, and a plate node being an upper electrode. In order to obtain a higher capacitance in a restricted area of the capacitor of the semiconductor memory device, research has been conducted in the following three areas: (1) a reduction in thickness of the dielectric film; (2) an increase in effective area of the capacitor; and (3) use of a dielectric film material having a high dielectric constant.

In a method for fabricating a capacitor using a material having a high dielectric constant, an oxide film and a nitride film or a composite film of oxide and nitride films was initially used as the dielectric film, but ongoing efforts have been made to use ditantalum pentoxide ($Ta_2O_5$), tita strontium trioxide ($SrTiO_3$), or tita strontium barium trioxide (($BaSr)TiO_3$), each having a high dielectric constant, instead of the above films. Ditantalum pentoxide ($Ta_2O_5$) has a dielectric constant of approximately 24, which is six times that of the oxide dielectric film. Thus, ditantalum pentoxide ($Ta_2O_5$) has been predicted as the most practical high dielectric film material up to now, even though leakage current has been high due to a deficiency of oxygen within the dielectric film.

The above-described technology has been disclosed in U.S. Pat. No. 5,079,191, "Process for Producing a Semiconductor Device", Jan. 7, 1992.

In the prior art, in order to reduce leakage current in a ditantalum pentoxide ($Ta_2O_5$) thin film resulting from a deficiency of oxygen, a dielectric film of ditantalum pentoxide is deposited and then oxidized at a temperature of 600 to 1000 degree C., thus supplying necessary oxygen to the dielectric film and simultaneously increasing the density of the dielectric film.

However, in this method, an oxide film having a low dielectric constant grows below the dielectric film, causing a reduction of the overall capacitance. Also, the high temperature for oxidation causes a decrease in the concentration of impurities on the surface of a lower electrode formed of polysilicon doped with impurities, thus greatly changing Cmin/Cmax.

SUMMARY OF THE INVENTION

To solve the above problems, it is an objective of the present invention to provide a method of forming a capacitor of a semiconductor device using high temperature oxidation, which can prevent disconnection between lower electrodes by forming an oxide of a second conductive film on an interlayer dielectric by depositing the metallic second conductive film on a semiconductor substrate on which the lower electrode is formed and oxidizing the deposited film, and which can obtain a high capacitance by forming both a silicide layer including the second conductive film, and an oxide of the second conductive film having a high dielectric constant, on the lower electrode, and using the silicide layer and the oxide as a dielectric film, on the basis of the characteristics that a conductive film of a silicide origin is oxidized by oxidation.

Accordingly, to achieve the above objective, in a method of forming a capacitor of a semiconductor device using high-temperature oxidation, first, a capacitor lower electrode pattern of a first polysilicon film is formed on a semiconductor substrate on which an interlayer dielectric is formed. A second conductive film is formed on the entire surface of the semiconductor substrate on which the capacitor lower electrode is formed. Silicide mixed with the second conductive film and an oxide of the second conductive film are formed on the capacitor lower electrode pattern by oxidizing the semiconductor substrate on which the second conductive film is formed, at a high temperature. Only the oxide of the second conductive film is formed on the interlayer dielectric. A dielectric film is formed on the semiconductor substrate on which the high temperature oxidation was performed. An upper electrode of a third conductive film is formed on the semiconductor substrate on which the dielectric film has been deposited.

According to a preferred embodiment of the present invention, the first polysilicon film is formed of polysilicon doped with impurities, and the second conductive film is formed of one material selected from the group consisting of titanium (Ti), tungsten (W), tantalum (Ta), molybdenum (Mo), platinum (Pt), cobalt (Co), palladium (Pd), nickel (Ni) and hafnium (Hf). Also, it is suitable that the dielectric film is a single film or a composite film including at least one film selected from the group consisting of an oxide film, a nitride film, and ditantalum pentoxide ($Ta_2O_5$), and that the third conductive film is formed of polysilicon doped with impurities, or a metal.

Preferably, in the high temperature oxidation, the semiconductor substrate is introduced into a chamber of a rapid thermal processing (RTP) apparatus, and rapid thermal oxidation (RTO) is performed on the semiconductor substrate for between 30 seconds and 5 minutes, under an oxygen atmosphere, at a temperature of 650 to 850 degree C. Alternatively, the semiconductor substrate is introduced into a furnace and dry-oxidized for between 5 minutes and one hour, under an oxygen atmosphere, at a temperature of 650 to 850 degree C. Or, the semiconductor substrate is introduced into a furnace and wet-oxidized for between 5 minutes and one hour, at a temperature of 600 to 800 degree C.

Also, it is preferable that post-processing on the dielectric film, such as ultraviolet ozone (UV-$O_3$) processing or oxidation, is further performed after the step of depositing the dielectric film.

According to the present invention, the oxide film of the second conductive film such as titanium dioxide ($TiO_2$) is formed on the interlayer dielectric using high temperature oxidation, so that disconnection between lower electrodes is prevented. Also, the silicide layer including the second conductive film, and the oxide of the second conductive film having a high dielectric constant, arc simultaneously formed on the lower electrode, and the result is used as the dielectric film, thereby obtaining a high capacitance in a process for forming a capacitor of a semiconductor device.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENT

Figure 1:
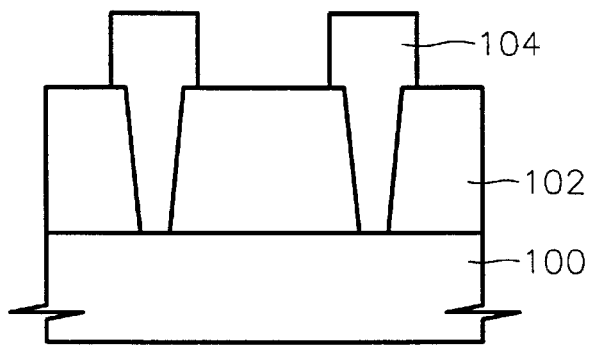
FIGS. 1 through 6 are cross-sectional views illustrating a method of forming a Capacitor of a semiconductor device using high temperature oxidation, according to the present invention.

Referring to FIG. 1, an interlayer dielectric (ILD) 102 is deposited on a semiconductor substrate 100 on which lower structures (not shown) such as a transistor and a bit line are formed, and the deposited ILD 102 is patterned to form a contact hole exposing a source region of the transistor. A first polysilicon film for covering the upper surface of the ILD 102 and filling the contact hole is formed of polysilicon doped with impurities, and the first polysilicon film is patterned thus forming a storage node pattern 104.

Figure 2:
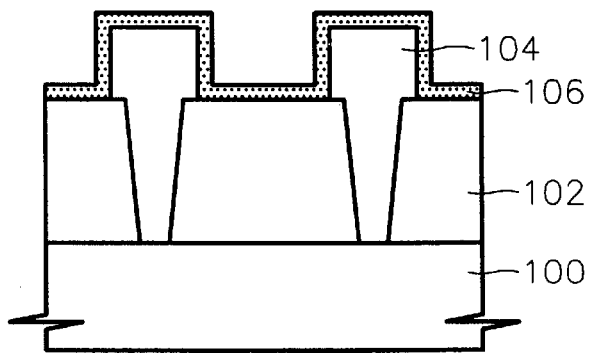

Referring to FIG. 2, a second conductive film 106, e.g. a titanium layer, is formed on the semiconductor substrate on which the storage node pattern 104 is formed. The second conductive film 106 can be formed of a material for forming a silicide, selected from the group consisting of titanium (Ti), tungsten (W), tantalum (Ta), molybdenum (Mo), platinum (Pt), cobalt (Co), palladium (Pd), nickel (Ni) and hafnium (Hf). Also, the second conductive film 106 can be formed by chemical vapor deposition (CVD), sputtering, or atomic layer deposition (ALD).

Figure 3:
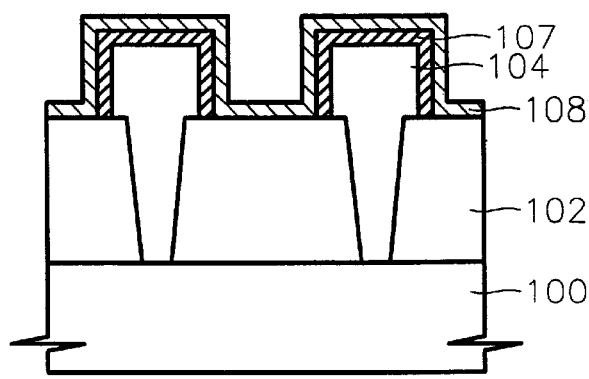

Referring to FIG. 3, a second conductive oxide 108 (e.g., a titanium dioxide ($TiO_2$) layer) for preventing short defects between the storage node patterns 104 is formed by performing high-temperature oxidation on the interlayer dielectric (ILD) 102 on which the second conductive film 106 is formed. Titanium silicide (TiSix) and a titanium dioxide ($TiO_2$) layer, being respectively a second conductive silicide 107 and the second conductive oxide 108, are simultaneously formed on the storage node pattern 104. Here, the titanium silicide 107 is formed selectively on only the storage node patterns 104. When the storage node is formed of a metal, the titanium suicide 107 is important to a structural change from an existing silicon insulator silicon (SIS) capacitor to a metal insulator metal (MIM) or metal insulator silicon (MIS) capacitor. Also, the titanium dioxide ($TiO_2$) layer 108 on the titanium silicide 107 has a high dielectric constant of at least 40, so that it is preferable to be used as a dielectric film having a high dielectric constant. Accordingly, the dielectric film is comprised of the titanium dioxide ($TiO_2$) 108 and ditantalum pentoxide ($Ta_2O_5$) which will be formed in the subsequent process, which makes it possible to obtain a high capacitance.

In the high temperature oxidation, the semiconductor substrate is introduced into a chamber of a rapid thermal processing (RTP) apparatus, and rapid thermal oxidation (RTO) can be performed for between 30 seconds and 5 minutes under an oxygen atmosphere at between 650 degree C. and 850 degree C. In an alternative high-temperature oxidation, the semiconductor substrate is introduced into a furnace, and dry oxidation is performed for between 5 minutes one hour under an oxygen atmosphere at between 650 degree C. and 850 degree C. According to another alternative high-temperature oxidation, wet oxidation can be preformed on the semiconductor substrate in the furnace, for between 5 minutes and one hour, at a temperature of 600 to 800 degree C.

Figure 4:
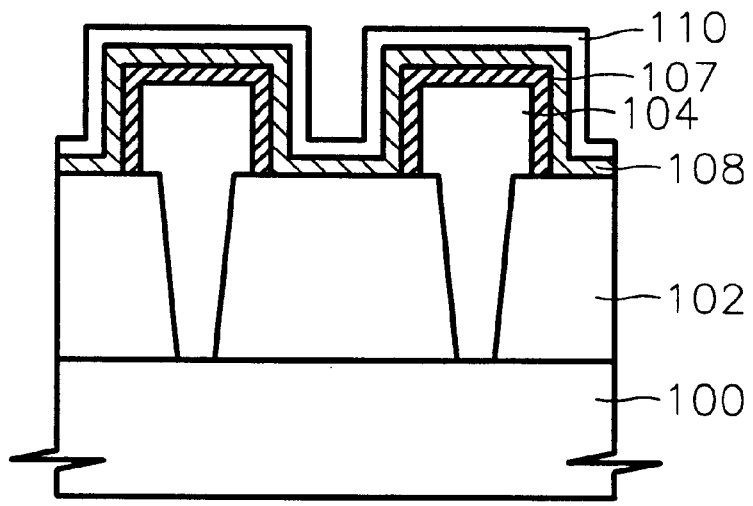

Referring to FIG. 4, low pressure CVD is performed on the semiconductor substrate on which the high-temperature oxidation was conducted, using a liquid source of $Ta(OC_2H_5)_5$ at a temperature of about 300 to 600 degree C., to deposit a dielectric film 110 of ditantalum pentoxide ($Ta_2O_5$) to a thickness of between 20 Å and 200Å. Thus, the dielectric film 110 is a composite film of ditantalum pentoxide ($Ta_2O_5$) having a dielectric constant of about 24 and titanium dioxide ($TiO_2$) having a dielectric constant of about 40. Also, the dielectric film 110 may be a single film or a composite film including at least one film selected from the group consisting of an oxide film, a nitride film and the ditantalum pentoxide film.

Figure 5:
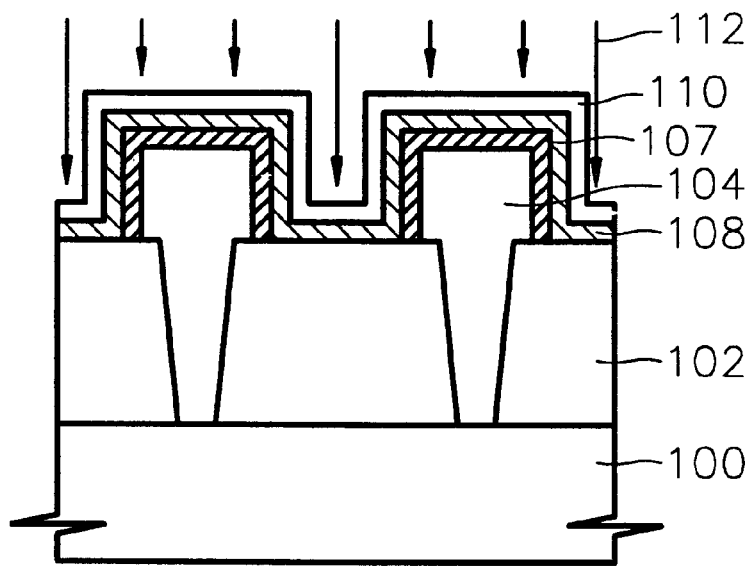

Referring to FIG. 5, a process for preventing deficiency of oxygen inside the dielectric film is preformed on the semiconductor substrate on which the dielectric film 110 is formed. According to such a process, oxygen 112 is supplied into the dielectric film 110 by performing thermal processing using ultraviolet ozone (UV-$O_3$) at temperature of between 100 degree C. and 400 degree C. for about 15 minutes. The oxygen 112 can also be supplied into the dielectric film 110 using oxidation, etc.

Figure 6:
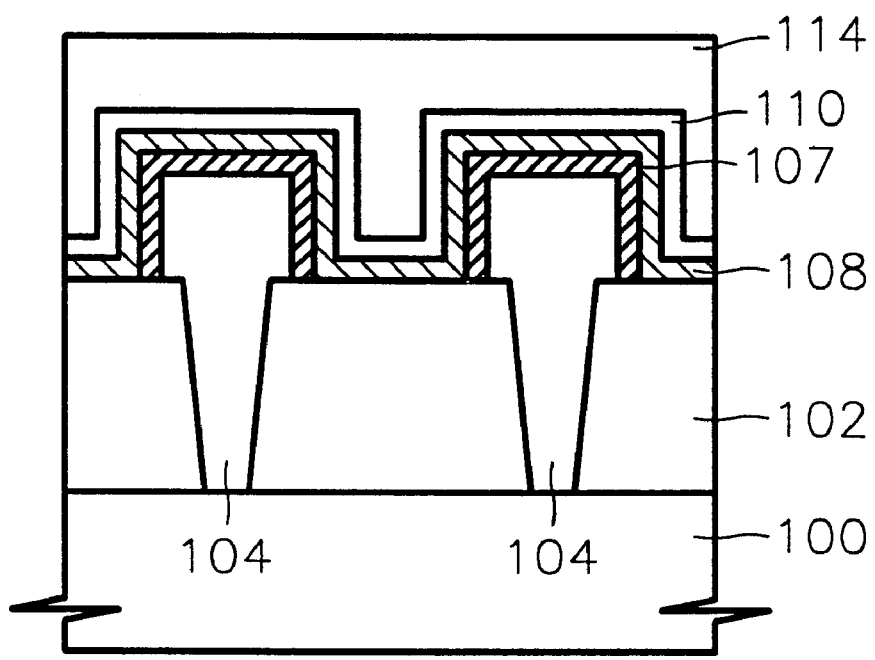

Referring to FIG. 6, an upper electrode 114 is formed on the entire surface of the semiconductor substrate to which the oxygen was supplied, using a third conductive film. The third conductive film may be formed of polysilicon doped with impurities, or a metal such as titanium nitride (TiN), silicide, or the like.

According to the present invention described above, the oxide film of the second conductive film such as titanium dioxide ($TiO_2$) is formed on the interlayer dielectric using high temperature oxidation, so that disconnection between lower electrodes is prevented. Also, the silicide layer including the second conductive film, and the oxide of the second conductive film having a high dielectric constant, arc simultaneously formed on the lower electrode, and the result is used as the dielectric film, thereby obtaining a high capacitance in a process for forming a capacitor of a semiconductor device.

The present invention is not limited to the above embodiment, and it is apparent that many modifications may be effected within the technical spirit of the present invention, by those skilled in the art.

What is claimed is:

1. A method of forming a capacitor of a semiconductor device using high-temperature oxidation, comprising the steps of:

forming a capacitor lower electrode pattern of a first polysilicon film on a semiconductor substrate on which an interlayer dielectric is formed;

depositing a second conductive film on the entire surface of the semiconductor substrate on which the capacitor lower electrode is formed;

forming silicide mixed with the second conductive film and an oxide of the second conductive film on the capacitor lower electrode pattern by oxidizing the semiconductor substrate on which the second conductive film is formed, at a high temperature, and forming only the oxide of the second conductive film on the interlayer dielectric;

depositing a dielectric film on the semiconductor substrate on which the high temperature oxidation was performed; and forming an upper electrode of a third conductive film on the semiconductor substrate on which the dielectric film has been deposited.

2. The method of forming a capacitor of a semiconductor device using high-temperature oxidation as claimed in claim 1, wherein the first polysilicon film is formed of polysilicon doped with impurities.

3. The method of forming a capacitor of a semiconductor device using high-temperature oxidation as claimed in claim 1, wherein the second conductive film is formed of one material selected from the group consisting of titanium (Ti), tungsten (W), tantalum (Ta), molybdenum (Mo), platinum (Pt), cobalt (Co), palladium (Pd), nickel (Ni) and hafnium (Hf).

4. The method of forming a capacitor of a semiconductor device using high-temperature oxidation as claimed in claim 1, wherein in the high temperature oxidation, the semiconductor substrate is introduced into a chamber of a rapid thermal processing (RTP) apparatus, and rapid thermal oxidation (RTO) is performed on the semiconductor substrate for between 30 seconds and 5 minutes, under an oxygen atmosphere, at a temperature of 650 degree C. to 850 degree C.

5. The method of forming a capacitor of a semiconductor device using high-temperature oxidation as claimed in claim 1, wherein in the high temperature oxidation, the semiconductor substrate is introduced into a furnace and dry-oxidized for between 5 minutes and one hour, under an oxygen atmosphere, at a temperature of 650 degree C. to 850 degree C.

6. The method of forming a capacitor of a semiconductor device using high-temperature oxidation as claimed in claim 1, wherein in the high temperature oxidation, the semiconductor substrate is introduced into a furnace and wet-oxidized for between 5 minutes and one hour, at a temperature of 600 degree C. to 800 degree C.

7. The method of forming a capacitor of a semiconductor device using high-temperature oxidation as claimed in claim 1, wherein the dielectric film is a single film or a composite film including at least one film selected from the group consisting of an oxide film, a nitride film, and ditantalum pentoxide ($Ta_2O_5$).

8. The method of forming a capacitor of a semiconductor device using high-temperature oxidation as claimed in claim 1, further comprising the step of post-processing the dielectric film after the step of depositing the dielectric film.

9. The method of forming a capacitor of a semiconductor device using high-temperature oxidation as claimed in claim 8, wherein ultraviolet ozone (UV-$O_3$) processing or oxidation is used for the post-processing.

10. The method of forming a capacitor of a semiconductor device using high-temperature oxidation as claimed in claim 1, wherein the third conductive film is formed of polysilicon doped with impurities, or a metal.

* * * * *

UNITED STATES PATENT AND TRADEMARK OFFICE
CERTIFICATE OF CORRECTION

PATENT NO. : 6,248,640 B1
DATED : June 19, 2001
INVENTOR(S) : Nam

Page 1 of 1

It is certified that error appears in the above-identified patent and that said Letters Patent is hereby corrected as shown below:

<u>Column 3,</u>
Line 3, "arc" should read -- are --.
Line 51, "titanium suicide" should read -- titanium silicide --.

<u>Column 4,</u>
Line 44, "arc" should read -- are --.

Signed and Sealed this

Seventh Day of May, 2002

Attest:

JAMES E. ROGAN
*Attesting Officer*     *Director of the United States Patent and Trademark Office*